United States Patent
Krokoszinski

(10) Patent No.: US 9,419,153 B2
(45) Date of Patent: Aug. 16, 2016

(54) PROCESS FOR MANUFACTURING A SOLAR CELL AND SOLAR CELL

(71) Applicant: SolarWorld Industries Thueringen GmbH, Amstadt (DE)

(72) Inventor: Hans-Joachim Krokoszinski, Erfurt (DE)

(73) Assignee: SolarWorld Innovations GmbH, Freiberg (DE)

( * ) Notice: Subject to any disclaimer, the term of this patent is extended or adjusted under 35 U.S.C. 154(b) by 0 days.

(21) Appl. No.: 14/473,043

(22) Filed: Aug. 29, 2014

(65) Prior Publication Data
US 2015/0059822 A1   Mar. 5, 2015

(30) Foreign Application Priority Data

Aug. 30, 2013   (DE) .......................... 10 2013 217 356

(51) Int. Cl.

| | |
|---|---|
| *H01L 21/00* | (2006.01) |
| *H01L 31/0224* | (2006.01) |
| *H01L 31/18* | (2006.01) |
| *H01L 31/046* | (2014.01) |
| *H01L 31/05* | (2014.01) |
| *H01L 31/0216* | (2014.01) |
| *H01L 31/02* | (2006.01) |
| *H01L 31/056* | (2014.01) |
| *H01L 31/042* | (2014.01) |

(52) U.S. Cl.
CPC .... *H01L 31/022441* (2013.01); *H01L 31/0504* (2013.01); *H01L 31/18* (2013.01); *H01L 31/02021* (2013.01); *H01L 31/02167* (2013.01); *H01L 31/022425* (2013.01); *H01L 31/042* (2013.01); *H01L 31/046* (2014.12); *H01L 31/05* (2013.01); *H01L 31/056* (2014.12); *Y02E 10/50* (2013.01)

(58) Field of Classification Search
CPC ..... H01L 31/18; H01L 31/042; H01L 31/056; H01L 31/046; H01L 31/022441; H01L 31/02167; H01L 31/022425; H01L 31/0504; H01L 31/02021
See application file for complete search history.

(56) References Cited

U.S. PATENT DOCUMENTS

| | | | | |
|---|---|---|---|---|
| 8,597,970 | B2* | 12/2013 | Cousins | ............ H01L 31/02167 257/E31.13 |
| 8,679,889 | B2* | 3/2014 | Cousins | ............ H01L 31/02168 257/E31.119 |
| 2010/0294347 | A1* | 11/2010 | Zimmer | ............ H01L 31/02008 136/252 |
| 2010/0313943 | A1* | 12/2010 | Knoll | .................. H01L 31/0296 136/255 |
| 2013/0213469 | A1* | 8/2013 | Kramer | ........... H01L 31/022458 136/256 |
| 2013/0228221 | A1* | 9/2013 | Moslehi | .......... H01L 31/022441 136/256 |
| 2014/0008746 | A1* | 1/2014 | Ferrao De Paiva Martins | .................. B82Y 40/00 257/431 |
| 2014/0318611 | A1* | 10/2014 | Moslehi | .......... H01L 31/022441 136/256 |

* cited by examiner

*Primary Examiner* — Nicholas Tobergte
(74) *Attorney, Agent, or Firm* — Maginot, Moore & Beck LLP

(57) ABSTRACT

A solar cell segment includes a substrate defining a rear side including a number of base doped regions and emitter doped regions. A dielectric layer and at least one metallizing layer are disposed on the rear side of the substrate. The at least one metallizing layer is structured in an interdigital comb-shaped contact deck arrangement and defines base contact decks for a number of base doped regions and emitter contact decks for a number of base doped regions. The at least one metallization layer is disposed between the rear side of the substrate and the dielectric layer. At least one first row of first contact openings is formed in the dielectric layer lying in a region of the base contact decks and at least one second row of second contact openings is formed in the dielectric layer lying in a region of the emitter contact decks.

11 Claims, 8 Drawing Sheets

PROCESS FOR MANUFACTURING A SOLAR CELL AND SOLAR CELL

This application claims priority under 35 U.S.C. §119 to patent application no. DE 10 2013 217 356.3, filed on Aug. 30, 2013 in Germany, the disclosure of which is incorporated herein by reference in its entirety.

The present disclosure relates to a process for manufacturing a solar cell and to a corresponding solar cell, particularly a solar cell with rear side contacts.

BACKGROUND

Rear side contact solar cells of the MWT (Metal Wrap Through) and IBC (Interdigitated Back Contact) type describe, on the one hand, desirable variants of silicon solar cells, because with this, the front side shadowing by the metallic conductor tracks and busbars and the copper strips soldered thereon is minimized or completely avoided, but on the other hand, they are also difficult to connect in series during the module integration, because the contacts at both the polarities should be made next to each other on the rear side. Therefore, it is a challenge for the metallic connection elements of one cell to be lead to other cell without making a short circuit at the metallic contact surfaces with the respective other polarity.

SUMMARY

In this context, a process for manufacturing a solar cell segment, a process for manufacturing a solar cell and a solar cell according to the main claims is introduced by the present disclosure. Advantageous configurations result from the respective subordinate claims and the following description.

A solar cell with rear side contacts can advantageously be realized, in which contact openings are provided disposed in series in a rear side coating of the solar cell, which enable the solar cell or solar cell segments to contact multi-electrodes enclosing one of at least two electrical cables.

A process for manufacturing a solar cell segment includes the following steps:

providing a substrate, wherein the rear side of the substrate has a number of base doped regions and a number of emitter doped regions, wherein a dielectric layer and at least one metallizing layer are disposed on the rear side of the substrate, wherein the at least one metallizing layer is structured in an interdigital comb shaped contact deck arrangement with base contact decks for the number of base doped regions and emitter contact decks for the number of emitter doped regions and is disposed between the rear side of the substrate and the dielectric layer;

making at least one first row of first contact openings in the dielectric layer in the region of the base contact decks, wherein the first row is oriented linear and transverse to the direction of longitudinal extension of the base contact decks and has a first contact opening per base contact deck; and making at least one second row of second contact openings in the dielectric layer in the region of the emitter contact decks, wherein the second row is oriented linear and transverse to the direction of longitudinal extension of the emitter contact decks and has a second contact opening per emitter contact deck.

According to an embodiment, a solar cell segment can be meant by a single solar cell or a half cell. According to another embodiment, several solar cell segments can be connected into a solar cell or into a solar cell string, normally in a series connection. A solar cell string can be meant by a series of solar cells or a series of half cells. Several solar cell strings can be connected into a solar cell module. According to the embodiment, a solar cell segment or even a half cell or a complete solar cell can be meant by a semiconductor device in the form of a solar cell. Such a solar cell may include a rear side contact structure for serial connection of many of these solar cell segments by means of a multiple-wire web. A solar cell segment can refer to an IBC (Interdigitated Back Contact). In the solar cell segment, both the diffusion structures n+ and p+ using the external contacting and thereby even the electrical contacts of the solar cell themselves are on the rear side of the cell.

A substrate of the solar cell segment can be meant by a semiconductor substrate. The base doped regions and the emitter doped regions can be spaced apart from each other or can be disposed touching each other on the rear side of the substrate. The rear side of the substrate can be meant by a side facing away from the incident light during solar cell operation.

The at least one metallizing layer can be suitable for making the contact decks. For example, a number of metallizing layers are used, which include for example, a solder contact layer, a conducting layer, a contacting layer, an adhesive layer and a reflection layer, or merely a few or just one of the mentioned layers or further layers not mentioned. A passivation layer and additionally or alternatively at least one insulation layer can be disposed between the surface of the substrate and the at least one metallizing layer.

The dielectric layer can be used as insulation layer and additionally or alternatively as covering layer. The dielectric layers can merely cover a surface of the contact deck arrangement and thus structured accordingly. Alternatively, the dielectric layer can be configured fully clad and for example, also covers the areas disposed between the base contact decks and the emitter contact decks.

An interdigital comb-shaped contact deck arrangement can be meant by a finger-like structure, wherein the contact decks appear like cogs of two combs and interlock without touching each other. The base contact decks can extend connected along the base doped regions or various base doped regions, and the emitter contact decks can extend connected along the emitter doped regions or various emitter doped regions.

A contact opening is meant by a round hole through the dielectric layer. A contact opening can be provided in order to electrically contact the at least one metallizing layer lying underneath the contact opening through the contact opening.

The contact openings of a row can be disposed linearly along a straight line. Adjoining rows can extend parallel to each other. The rows can cross the base contact decks and the emitter contact decks at right angles.

According to an embodiment, the step of providing the substrate includes a step of providing the substrate, a step of applying the at least one metallizing layer and the dielectric layer and a step of structuring the at least one metallizing layer and the dielectric layer for making the interdigital comb shaped contact deck arrangement. Structuring is meant by that material of the dielectric layer and the number of metallizing layers is removed in order to make the structure of the interdigital comb-shaped contact deck arrangement. Advantageously, the dielectric layer along with the at least one metallizing layer can be applied on the substrate in this manner.

Alternatively, the step of providing the substrate includes a step of providing the substrate, a step of applying the at least one metallizing layer, a step of structuring the at least one metallizing layer for making the interdigital comb shaped contact deck arrangement and a step of applying the dielectric layer on at least one surface of the contact deck arrangement. Thus, the dielectric layer can be applied fully clad in a separate working step after the structuring of the at least one metallizing layer.

According to an embodiment, in the step of making at least one first row, at least two first rows of the first contact openings are made in the dielectric layer lying in the region of the base contact decks. Therefore, the two first rows are oriented linear and transverse to the direction of longitudinal extension of the base contact decks and have two first contact openings per base contact deck. Accordingly, in the step of making, at least two second rows of second contact openings are made in the dielectric layer lying in the region of the emitter contact decks. Therefore, the two second rows are oriented linear and transverse to the direction of longitudinal extension of the emitter contact decks and have two second contact openings per emitter contact deck. In this manner, the solar cell segment can be provided at distances suitable for the functioning of the solar cell segment with contacting points in the form of contact openings. More than two first and second rows of contact openings can also be provided.

For example, in the step of making, an even number of 10 to 80 rows, i.e. 5 to 40 first rows and 5 to 40 second rows can be made. Alternately, equal number of first rows and second rows can be made. Therefore, the number of rows can be matched with a respective embodiment of the solar cell segment or of the solar cell.

In the step of making the at least two first and at least two second rows, the first and second rows can be made such that one of the two second rows extends centrally between the two first rows. An alternative sequence of first and second rows can be provided. Thus, respectively one first row can be disposed centrally between two second rows and a second row can be disposed centrally between two first rows. The distance between any two adjoining rows can be constant along the main direction of extension of the contact decks. Thus, a uniform contacting of the solar cell segment can be realized.

According to an embodiment, in the step of making, the contact openings can be made by laser ablation. As a result, the material of the dielectric layer can be removed in a much targeted manner in the region of the contact openings.

For example, in the step of making, the contact openings can be made as elongated openings or as final rows of adjoining or partially overlapped circular openings. Therefore, the direction of longitudinal extension of the contact openings extends parallel to the direction of longitudinal extension of the base contact decks and the emitter contact decks. The elongated shape of the contact openings can simplify the contacting with an electrical cable.

The process can include a step of connecting the first contact openings of the at least one first row of first contact openings to a first electrical cable and a step of connecting the second contact openings of the at least one second row of second contact openings to a second electrical cable. An electrical cable can be provided per row. An electrical cable can be configured as a wire. A multiple-wire electrode of the solar cell segment can be made by the electrical cables.

A process for manufacturing a solar cell includes the following steps:
providing a first solar cell segment manufactured according to the mentioned process for manufacturing a solar cell segment and providing a second solar cell segment manufactured according to the mentioned process for manufacturing a solar cell segment, wherein the first solar cell segment and the second solar cell segment are disposed next to each other and the at least one first row of first contact openings of the first solar segment aligns with the at least one second row of second contact openings of the second solar segment and the at least one second row of second contact openings of the first solar segment aligns with the at least one first row of first contact openings of the second solar segment; and
connecting the first contact openings of the at least first row of first contact openings of the first solar segment and the at least one second row of second contact openings of the second solar segment to a first electrical cable; and
connecting the second contact openings of the at least one second row of second contact openings of the first solar segment and the at least one first row of first contact openings of the second solar segment to a second electrical cable.

In this manner, two or more solar cell segments can be connected to a solar cell. Contiguous solar cell segments can be disposed rotated by 180° with respect to each other; however they have the same construction. As a result, the manufacturing costs can be saved.

Therefore, the process can include a step of interrupting either the first electrical cable or the second electrical cable at a junction region between the first solar cell segment and the second solar cell segment. As a result, the series connection is obtained by a connection of two solar cell segments and an electrical short-circuit is prevented.

A corresponding solar cell has the following features:
a first solar cell segment with a substrate, which has a number of base doped regions and a number of emitter doped regions on the rear side, wherein a dielectric layer and at least one metallizing layer are disposed on the rear side of the substrate, wherein the at least one metallizing layer is structured in an interdigital comb-shaped contact deck arrangement with base contact decks for a number of base doped regions and emitter contact decks for a number of emitter doped regions and is disposed between the rear side of the substrate and the dielectric layer; and wherein the dielectric layer has a first row of first contact openings in the region of the base contact decks, wherein the first row is oriented linear and transverse to the direction of longitudinal extension of the base contact decks and has a first contact opening per base contact deck; and
wherein the dielectric layer has a second row of second contact openings in the region of the emitter contact decks, wherein the second row is oriented linear and transverse to the direction of longitudinal extension of the emitter contact decks and has a second contact opening per emitter contact deck;
at least one second solar cell segment having a substrate, which has a number of base doped regions and a number of emitter doped regions on the rear side, wherein a dielectric layer and at least one metallizing layer are disposed on the rear side of the substrate, wherein the at least one metallizing layer is structured in an interdigital comb shaped contact deck arrangement with base contact decks for a number of base doped regions and emitter contact decks for a number of emitter doped regions and is disposed between the rear side of the substrate and the dielectric layer, and wherein dielectric layer has a first row of first contact openings in the region of the base contact decks, wherein the first row is oriented linear and transverse to the direction of longitudinal extension of the base contact decks and has a first contact opening per base contact deck and wherein the dielectric layer has a second row of second contact openings in the region of the emitter contact decks, wherein the second row is oriented linear and transverse to the direction of longitudinal extension of the emitter contact decks and has a second contact opening per emitter contact deck;

at least one first linearly extending electrical cable, which makes an electrical connection of the first contact openings of the at least one first row of first contact openings of the first solar cell segment and the at least one second row of second contact openings of the second solar cell segment;

at least one second linearly extending electrical cable, which makes an electrical connection of the second contact openings of the at least one second row of second contact openings of the first solar cell segment and the at least one first row of first contact openings of the second solar cell segment; and an interruption of either the at least one first electrical cable or the at least one second electrical cable, disposed at a junction region between the first solar cell segment and the second solar cell segment.

At a number of first cables and a number of second cables, respectively all first cables or alternatively all second cables can be interrupted in the junction region between two directly adjacently disposed solar cell segments.

BRIEF DESCRIPTION OF THE DRAWINGS

The disclosure is explained in more details in the following with the help of the exemplary accompanying drawings. They show.

DETAILED DESCRIPTION

Figure 1:
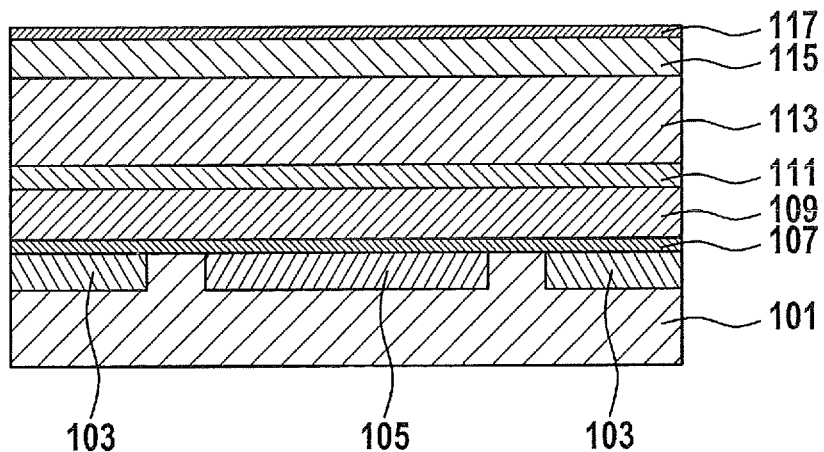
FIG. 1 shows a stack of layers of a solar cell segment according to an exemplary embodiment of the present disclosure.

In the following description of more advantageous exemplary embodiments of the present disclosure, same or similar reference numerals are used for the elements represented in the different figures and acting similarly, wherein a repeated description of these elements is dispensed with.

The FIGS. 1 to 10 show schematic representations of exemplary embodiments of the present disclosure. Therefore, it is left open whether the shown wafers relate to fully square or pseudo quadratic wafer. The exemplary embodiments marked in the figures are to be seen only as illustrative and in principle and in no way limit the geometrical shapes and dimensions.

A rear side coating and a contact structure for the IBC type solar cell is suggested, which enable the connection of the cells of this type with a multiple-wire electrode. As a result, a series connection of rear side contact solar cells can be made.

In comparison to a so-called ribbon technique, no rigid connection of two cells with at least six 1.5 mm width and 0.1 to 0.2 mm thick copper ribbon based on the different coefficients of thermal expansion of copper and silicon leads to high voltages and potentially leads to bending of cells. Thus, during the life cycle of a module, fatigue fractures of the connection points (solder points or glue points) or microcrack propagation can be avoided by the many thermal cycles, which in turn can avoid the module failure. It is also not necessary that in the ribbons, the regions between the contact surfaces should be covered with the solder mask, so that the ribbons cause no short-circuits.

In comparison to a so-called film technique, no multi-layer, fully clad films should be interconnected and partly structured. Thus, no films are required, which should be temperature resistance and stable over the long-term. Therefore, the required cost-effectiveness in price per square meter can be achieved. As a result of films not required, it is not necessary to insert—between the upper side of the film and the cell—an encapsulation foil (EVA or other), which has recesses on the connection pads, so that it can be soldered or glued there. As a result, such difficult to manufacture (stampings of "rubber-like" material) and thus costly perforation can be dispensed with. Further, the difficulty calibrated application of such a perforated soft film coating with 1.60 m×1.00 m size on the conductor deck surface, without touching the contact surfaces covered with solder or glue, can be dispensed with.

In comparison to the so-called shaping wire technique, it can be omitted to cut, to deform, to place, to solder or to glue at least six, maximum 10 wires. As a result, a complicated, special to be developed stringer variant is necessary. The wires of the shaping wire technique require a relatively large wire diameter with an expected current of 9-10 A per cell, thus 2-3 A per wire in order to show not too high electrical resistance, which impairs the filling factor of the module.

Multiple-wire electrodes show a very good compromise between the so-called connection techniques known until now, however could not be employed still for IBC-solar cells, because there is no rear side contact structure, which enables a correct series connection of neighbouring cells by means of linearly tightened multiple-wire web.

As described with the help of the following exemplary embodiments, for IBC-cells a rear side contact structure is proposed, which allows the application of the multiple-wire electrodes as a simple, cost-effective connection technique for IBC-solar cells by means of multiple-wire electrodes.

The rear side structure of the IBC-cell is explained in the following with the help of the FIGS. 1 to 10 based on exemplary embodiments.

FIG. 1 shows a stack of layers for a solar cell segment according to an exemplary embodiment of the present disclosure. The stack of layers can be used in order to manufacture the solar cell segment according to a process for manufacturing a solar cell segment.

The stack of layers has a substrate 101, also referred to as wafer in the following. On a rear side of the substrate 101, i.e. the side lying above here, two exemplary base doped regions 103 and an emitter doped region 105 disposed between the two base doped regions 103 are shown. The rear side surface of the substrate 101, i.e. surfaces of the base doped regions 103 and the emitter doped regions 105 and the regions of the substrate 101 lying between the base doped regions 103 and the emitter doped regions 105 are covered by a passivation layer 107. An insulation layer 109, a metallic contact layer, adhesive layer and reflection layer or sequence of layers 111, a conducting layer 113, a solder contact layer or sequence of solder contact layers 115 and a dielectric layer 117 which is used as dielectric covering layer and/or dielectric insulation layer are disposed on the passivation layer 107 in a stacked manner. The layers 107, 109, 111, 113, 115, 117 are respectively applied as continuous layers on the substrate 101 or the respective previously applied layer. The dielectric layer 117 is located on the rear side of the cell.

According to an exemplary embodiment, the stack of layers refers to a stack of layers on the rear side of an IBC-cell with additional dielectric covering layer 117.

For applying the stack of layers, known processes for applying a stack of metallic layers on the rear side of IBC-cells can be used. For example, the stack of layers shown can be deposited by means of PVD-methods (Physical Vapor Deposition), i.e. sputtering or evaporation or by screen-printing on an insulating layer 109, so that a stack of layers results, as it is shown in FIG. 1. The organic or inorganic insulating layer 109 can be applied on the dielectric passivation layer 107 of the semiconductor surface of the substrate 101 and has a plurality of small recesses under the metal fingers, in which the passivation layer 107 should be opened, so that the stack of metallic layers can locally contact the wafer surface of the substrate 101 in the region of the respective doped regions 103, 105 there, i.e. the emitter doped regions or base doped regions. Such "local contacts" are not shown in FIG. 1. By the application of PVD-methods, the metallic coating is initially fully clad, i.e. deposited over all local emitter doped regions 105 and base doped regions 103 and normally consists of three layers or sequence of layers listed in the following.

First, an optional contact layer or sequence of contact layers 111 on the insulating layer 109, which improves the bonding, the contact making in the region of the local contacts and the optical reflection in the infrared range, is applied over the entire rear side.

Second, a conducting layer 113 is applied on the contact layer or sequence of contact layers 111 or on non-available optional contact layer or sequence of contact layers 111 on the insulating layer 109. The conducting layer 113 generally consists of Aluminium, if necessary with small proportions of Silicon. If the optional contact layer 111 is omitted, the Aluminium assumes all the functions of the contact layer 111 as well.

Third, an optional solder contact layer or sequence of solder contact layers 115, which has a noble, i.e. non-oxidizing or non-corroding surface, so that the regions remaining open can be continuously soldered, is applied on the conducting layer. The solder contact layer 115 can also be realized as a stack of one, two or for example three layers and is required only if it must be soldered.

According to an exemplary embodiment of the present disclosure, a similar fully clad deposited dielectric covering/insulation layer 117 is disposed on the perforated insulation layer 109 as a supplement to the rear side stack of metallic PVD-layers 111, 113, 115. The dielectric layer 117 can be deposited either right after the fully clad deposition of the stack of metallic layers 111, 113, 115, i.e. in the same system without vacuum interruption or however (not marked in FIG. 1) only after structuring of the stack of metallic layers shown in FIG. 2, in which trenches can be made between contact decks for the emitter and base contacts by a suitable process. In this case, not only PVD-systems, but PECVD (Plasma Enhanced Chemical Vapor Deposition) Systems are also considered for deposition of the dielectric layer 117. In screen printing metallization (not shown), the deposition of the dielectric layer 113 is always carried out after (per se structuring) metal deposition and baking of the paste. Finally in all the cases, the areas provided on the contact decks for making contacts with the wire-web and for gauging contacts in accordance with the disclosure are preferably exposed by means of laser ablation of the dielectric covering layer 117.

Figure 2:
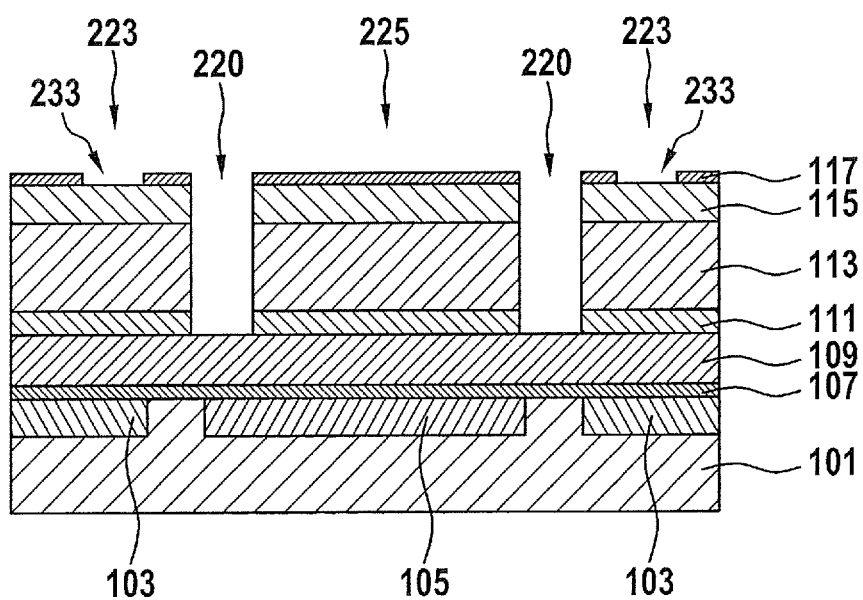
FIG. 2 shows a stack of layers of a solar cell segment according to an exemplary embodiment of the present disclosure.

FIG. 2 shows a stack of layers for a solar cell segment according to an exemplary embodiment of the present disclosure. The stack of layers corresponds to the stack of layers shown in FIG. 1, with the difference that a structuring of the stack of layers is already carried out. The structuring is also realized by trenches 220, in this exemplary embodiment, which extend through the dielectric layer 117 and the number of metallizing layers 111, 113, 115. Contact decks, two base contact decks 223 for the two base doped regions 103 and an emitter contact deck 225 for the one emitter doped region 105 shown here, are made by the trenches 220. The contact decks 113, 115 are disposed on the insulation layer 109 and include the number of metallizing layers 111, 113, 115 and the dielectric layer 117. As shown in the subsequent figures, the contact decks 113, 115 make an interdigital comb shaped contact deck arrangement, in which the base contact decks 223 and the emitter contact decks 225 are intermeshed spatially separated by the trenches 220.

The dielectric layer 117 has a number of rows of contact openings. In the region of the contact openings, the material of the dielectric layer 117 is removed up to the surface of the solder contact layer 115 lying thereunder, so that the solder contact layer 115 can be contacted throughout by the contact openings.

Two first contact openings 233 are shown in FIG. 2, which are disposed in the dielectric layer 117 in the region of the base contact decks 223. The two first contact openings 233 are part of two first rows of contact openings 233, as it is shown subsequently with the help of FIG. 4. The emitter contact deck 225 has one or more second contact openings, as they are shown with the help of FIG. 4.

Thus, the stack of layers shown in FIG. 2 is represented after division of the decks 223, 225 and opening of the contacts 233.

According to an exemplary embodiment, the contact openings 233 refer to laser ablated openings in the dielectric covering layer 117.

Figure 3:
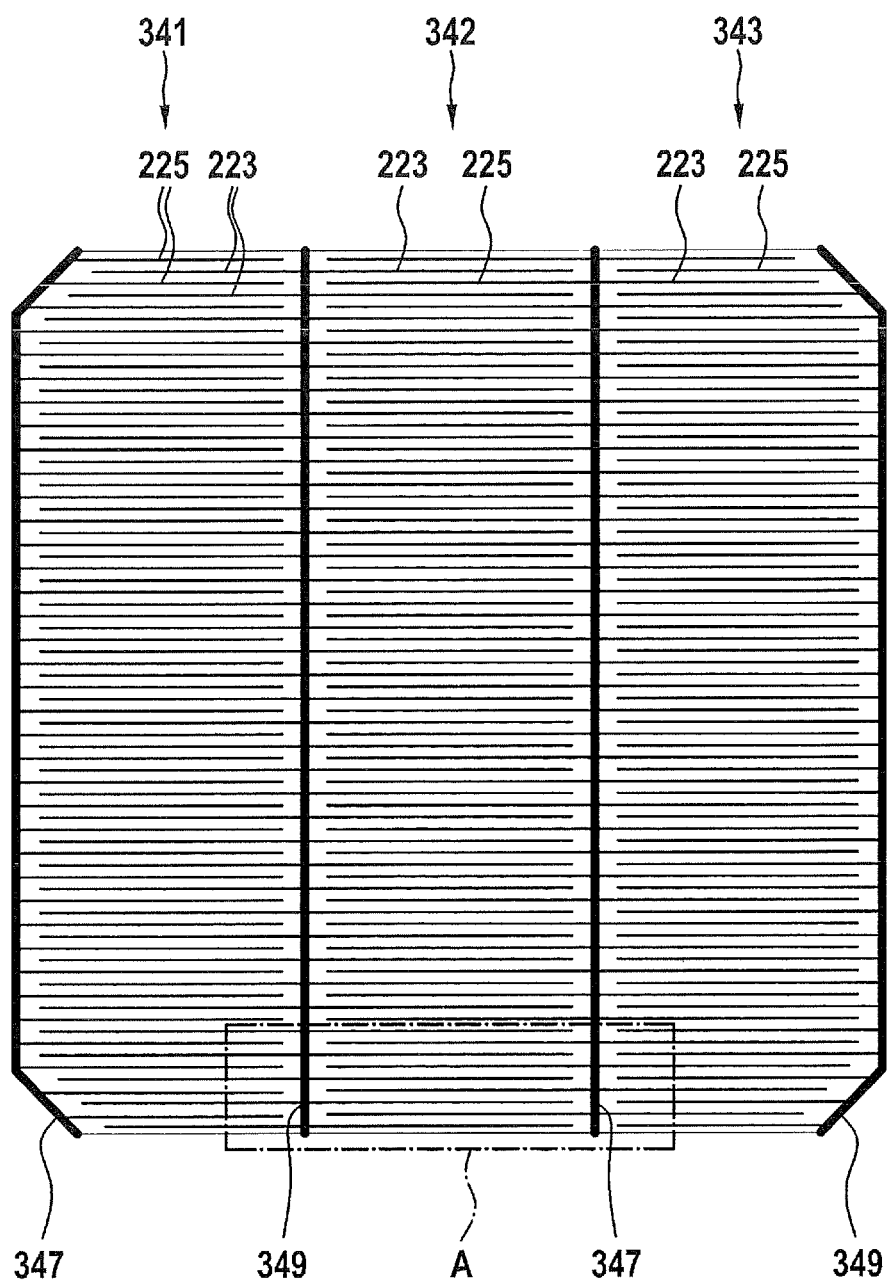
FIG. 3 shows a rear side view of a solar cell segment according to an exemplary embodiment of the present disclosure.

FIG. 3 shows a rear side view of a solar cell segment according to an exemplary embodiment of the present disclosure. A top view is shown on a comb shaped arrangement of base contact decks 223 and emitter contact decks 225, as they are described with the help of FIG. 2. All contact decks 223, 225 can extend without interruption of the edge of the solar cell segment up to the opposite edge. Or the base contact decks 223 and emitter contact decks 225 can be disposed in three columns 341, 342, 343, as illustrated here. The base contact decks 223 and emitter contact decks 225 are disposed transverse to the direction of longitudinal extension of the columns 341, 342, 343 parallel to each other and alternately in each of the columns 341, 342, 343. Here, alternatively means that a base contact deck 223 and an emitter contact deck 225 is disposed alternately.

Two base bus bars 347 and two emitter bus bars 349 are shown further in FIG. 3 merely for illustration. By a bus bar is meant a Busbar. The base busbars 347 and emitter busbars 349 can have the same layer structure as the contact decks 223, 225. The first column 341 of contact decks 223, 225 is disposed between the first of the two base busbars 347 and the first of the two emitter busbars 349. The ends of the base contact decks 223 facing the first base busbar 347 are directly and electrically conductively connected to the first base busbar 347. The base contact decks 223 with the base doped regions lying thereunder can be lead into up to the base busbar 347. The ends of the base contact decks 223 located opposite are configured as free ends and show in the direction of the first emitter busbar 349; are however spaced apart and electrically insulated from the first emitter busbar 349. The ends of the emitter contact decks 225 facing the first emitter busbar 349 are directly and electrically conductively connected to the first emitter busbar 349. The emitter contact decks 225 with the emitter doped regions lying thereunder can be lead into up to the first emitter busbar 349 or run through this. The ends of the opposite emitter contact decks 225 are configured as free ends and show in the direction of the first base busbar 347; are however spaced apart and electrically insulated from the first base busbar 347.

In a similar manner, the contact decks 223, 225 of the second column 342 are disposed between the first emitter busbar 349 and one of the two base busbars 347. The contact decks 223, 225 of the third column 343 are disposed between the second base busbar 347 and one of the two emitter busbars 349.

Figure 4:
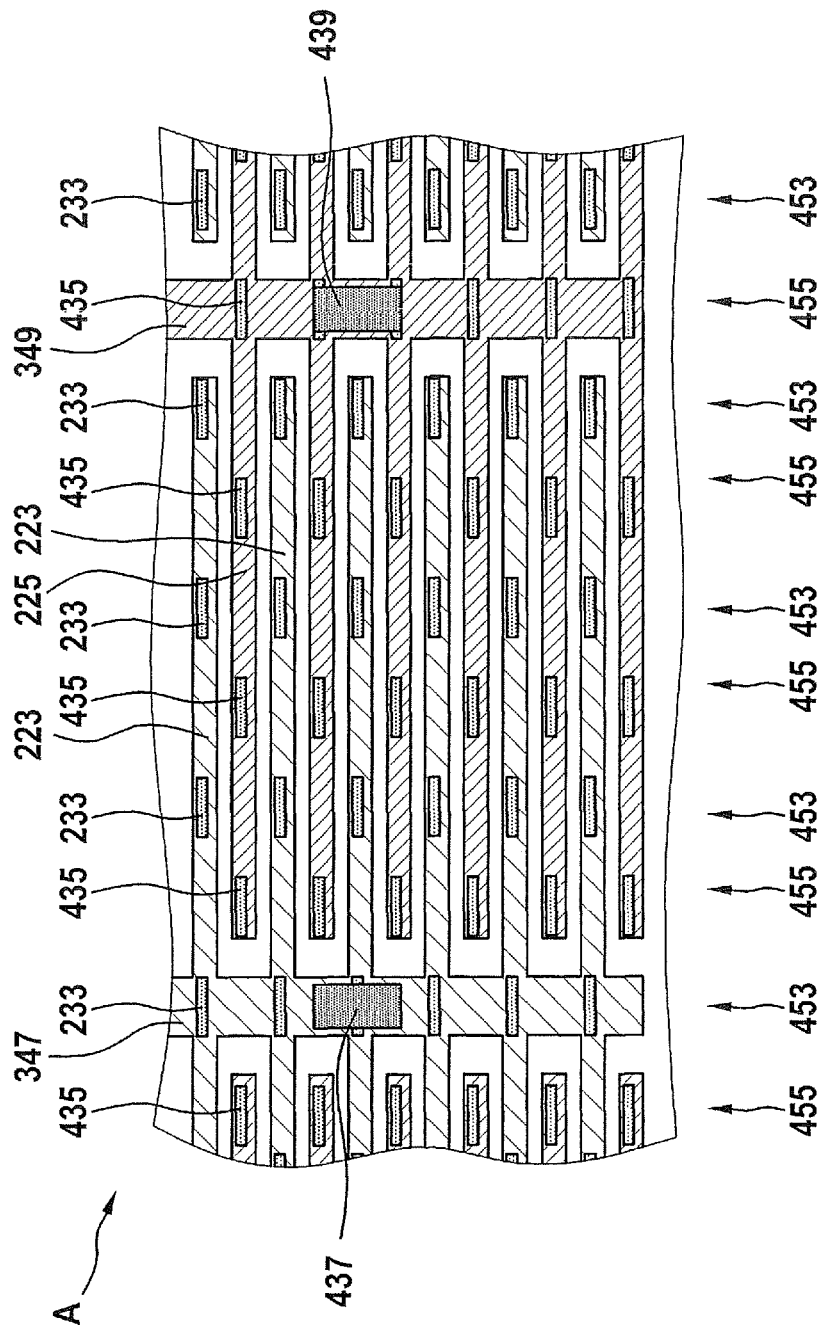
FIG. 4 shows a rear side view of a section of a solar cell segment according to an exemplary embodiment of the present disclosure.

In FIG. 4, the deck structure developed after opening of the trenches is represented as an example for an exemplary embodiment with three part cells made with two emitter busbars 349 and two base busbars 347 by the columns 341, 342, 343. These busbars 347, 349 are required only in order to be able to electrically contact and measure the cells under a blinker. They are not necessary for the contact structure in accordance with the disclosure, thus can also be omitted.

FIG. 4 shows a rear side view of a section A of a solar cell segment according to an embodiment of the present disclosure. A position of the section A is marked in FIG. 3. The section shows contact decks 223, 225 and busbars 347, 349 of an IBC-cell in a possible variant.

The arrangement of contact regions is shown in FIG. 4, which include the contact openings 233, 435 in the region of the base contact decks 223 and the emitter contact decks 225 already described with the help of FIG. 2.

Each base contact deck 223 has a number of first contact openings 233. According to this exemplary embodiment, the distances between two adjoining first contact openings 233 are same over the lengths of the base contact decks 223. The several first contact openings 233 is disposed in several first rows 453. Therefore, each first row 453 includes only one first contact opening 233 per base contact deck 223. Five first rows 453 of first contact openings 233 are shown in FIG. 4. The first contact openings 233 of a single first row 453 are aligned with respect to each other, so that the respective first row 453 has a straight line course. The first rows 453 are disposed parallel to each other and extend lengthwise to the busbars 347, 349 and transverse to the contact decks 223, 225.

Each emitter contact deck 225 has a number of second contact openings 235. According to this exemplary embodiment, the distances between two adjoining second contact openings 235 are same over the lengths of the emitter contact decks 225. The several second contact openings 235 are disposed in several second rows 455. Therefore, each second row 455 includes only one second contact opening 235 per emitter contact deck 225. Five second rows 455 of second contact openings 235 are shown in FIG. 4. The second contact openings 235 of a single second row 455 are aligned with respect to each other, so that the respective second row 455 has a straight line course. The second rows 455 are disposed parallel to each other and extend lengthwise to the busbars 347, 349 and transverse to the contact decks 223, 225.

According to this exemplary embodiment, the contact openings 233, 235 have an elongated shape with a length extending parallel to the directions of longitudinal extension of the contact decks 223, 225, the length is for example at least five times as long as the width of the contact openings 233, 235. The contact openings 233, 235 are openings in the dielectric covering layer, for example made by laser ablation.

If the optional busbars 347, 349 are provided in the design, then according to this exemplary embodiment, pad regions 437 provided on their surfaces for the placement of measurement contacts exposed by means of laser ablation. The pad regions 437 form pads for measurement contact pins. A pad region 437 on the base busbar 347 and a pad region 439 on the emitter busbar 349 are shown in FIG. 4.

As shown in FIG. 4, the laser ablated elongated openings 233, 235 in the dielectric layer are offset with respect to each other on the base contact decks 223 and the emitter contact decks 225. According to this exemplary embodiment, the openings 233, 235 preferably lie respectively at the center of the distance between two openings 233, 235 of the respective other polarity on the neighbouring decks 223, 225. The width of the openings 233, 235 is sufficiently large, so that thin wires to be placed thereupon, as shown in the subsequent figures, can reliably contact considering all positioning tolerances.

Figure 5:
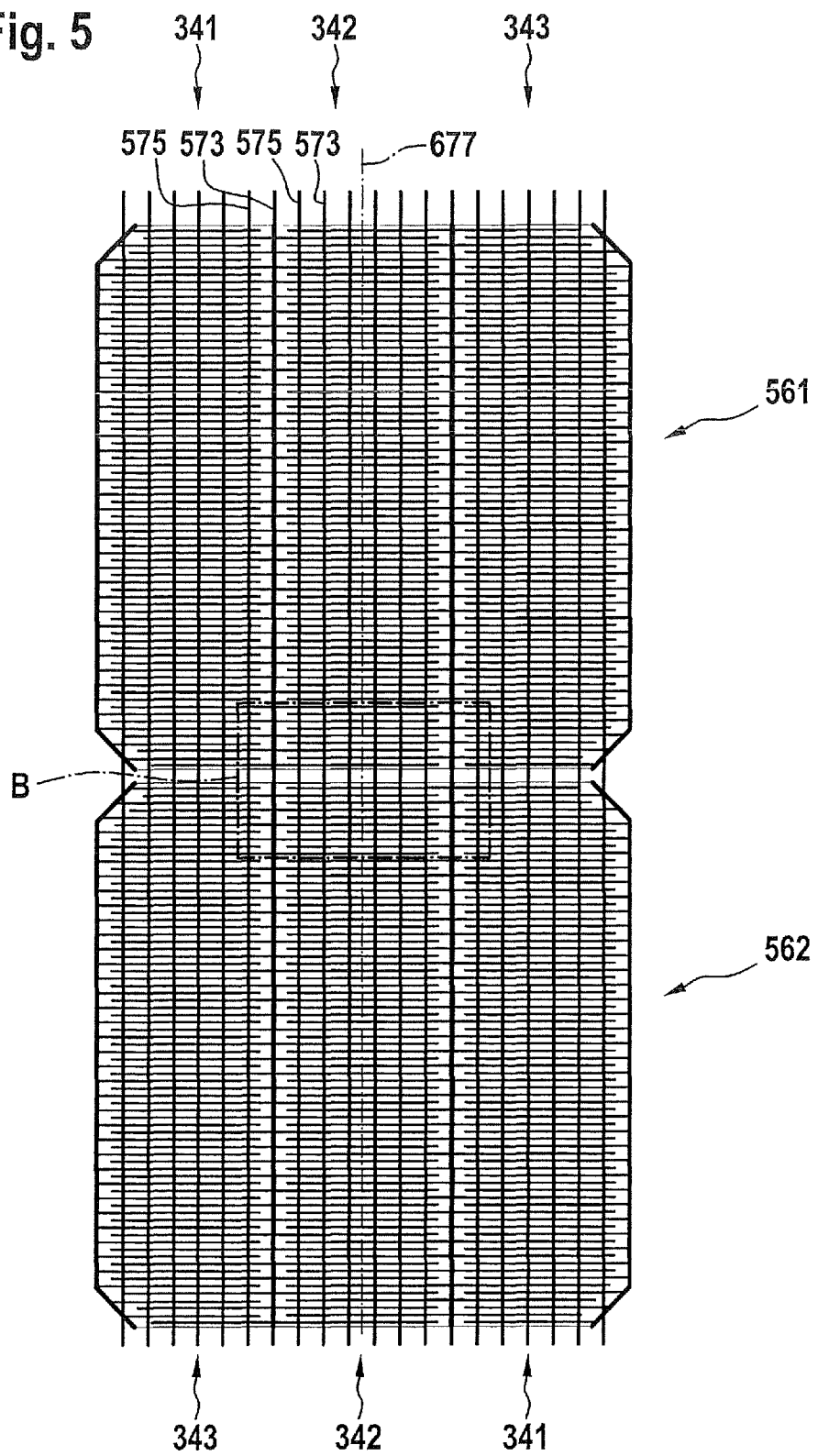
FIG. 5 shows a rear side view of a solar cell according to an exemplary embodiment of the present disclosure.

As is shown with the help of FIG. 5, respectively one electric line, subsequently also referred to as wire, is laid over each of the rows 453, 455 in a subsequent process step. FIG. 5 shows a rear side view of a solar cell currently under construction according to an exemplary embodiment of the present disclosure. The solar cell includes two solar cell segments 561, 562, which can be built as described with the help of previous figures. Complementary to the construction described up to FIG. 4, a number of first electrical lines 573 are shown in FIG. 5, which extend in the region of the first solar cell segment 561 along the first rows of first contact openings and extend in the region of the second solar cell segments 562 along the second rows of second contact openings. Further, a number of second electrical lines 575 are shown which extend in the region of the first solar cell segment 561 along the second rows 562 of second contact openings and in the region of the second solar segment 562 along the first rows of first contact openings. The electrical lines 573, 575 are configured as thin wires. The electrical lines 573, 575 span through a junction between the two solar segment 561, 562 disposed interlocking.

Both the solar cell segments 561, 562 can be configured same. Both the solar cell segments 561, 562 are disposed rotated at 180° relative to each other. In addition, the rows of the contact openings of the solar cell segments 561, 562 are aligned with respect to each other such that the first rows of the first solar cell segment 561 align with the second rows of the second solar cell segment 562. A line of symmetry 677 extends centrally through the central column of both the solar cell segments 561, 562.

The electrical lines 573, 575 are introduced within a framework for the insertion and fixation of a multiple-wire web. For this purpose, as shown in FIG. 5, neighbouring cells 561, 562 are positioned with respect to each other with a rear side contact structure in 180° rotation about their center, so that subsequently a number of thin parallel wires 573, 575 of a multiple-wire electrode can be introduced on the cells 561, 562 and can be fixed on the surface. The framed section B between two cells 561, 562 is represented enlarged in the FIGS. 6 to 8.

Figure 6:
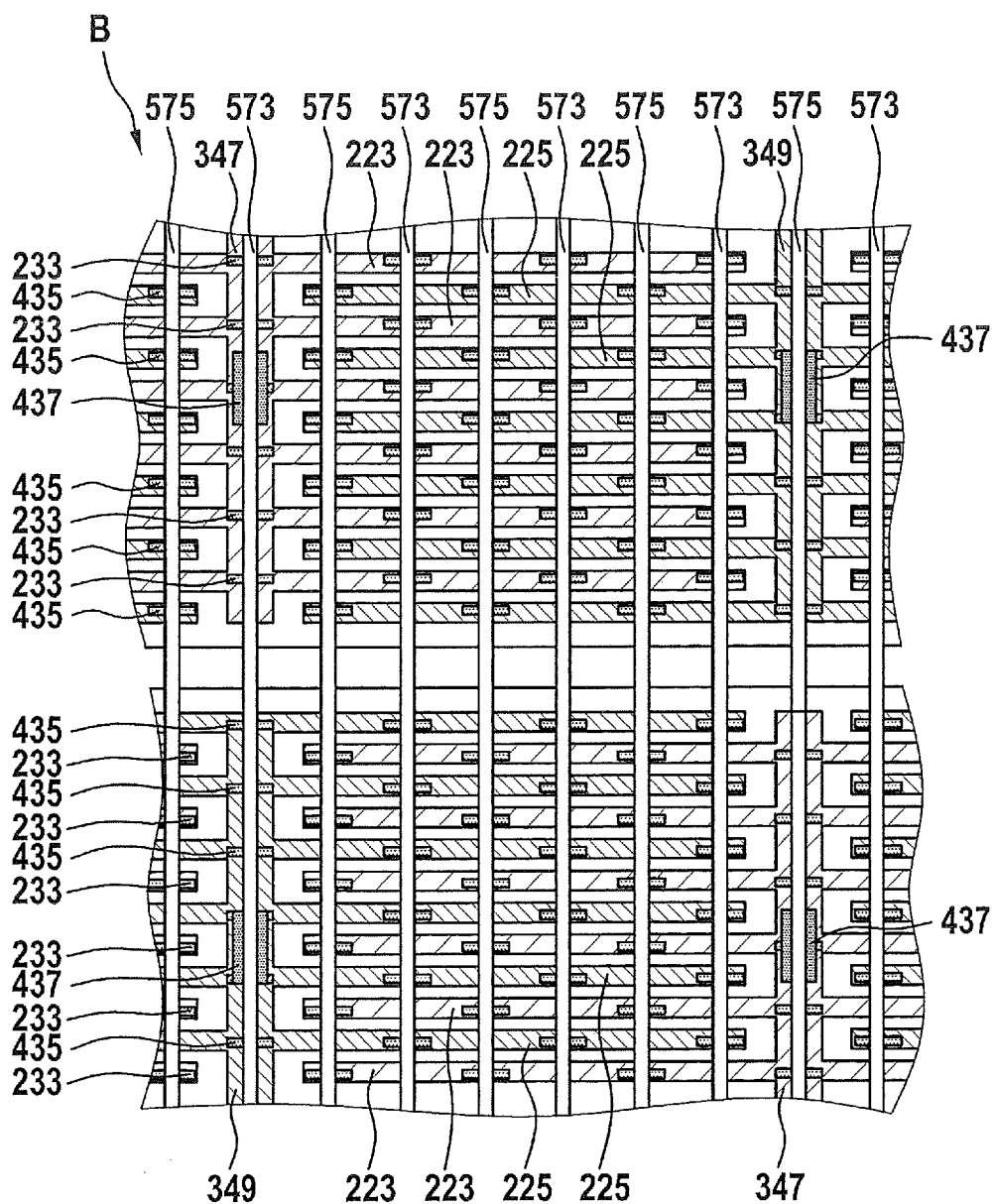
FIG. 6 shows a rear side view of a section of a solar cell according to an exemplary embodiment of the present disclosure.

FIG. 6 shows a rear side view of a section B of a solar cell according to an exemplary embodiment of the present disclosure. Section B refers to the section B shown in FIG. 5. The electrical lines 573, 575 are shown guided approximately centrally over the contact openings 233, 435. Those of the electrical lines 573, 575 which extend along the busbars 347, 349, additionally extend approximately in the center over the measurement points or pads 437, 439.

It can be inferred from the detailed representation of the wire positioning on the openings 233, 435, 437, 439 in the dielectric covering layer that by thin parallel wires 573, 575 as known ribbon conductors, the emitter contact decks 235 of the cell 562 represented below in FIG. 6 are connected to the base contact decks 223 of the cell 561 represented above in FIG. 6 and vice-versa without leaving their straight line. For this series connection of the cells 561, 562, the optional emitter and base busbars 347, 349 are integrated in the inner region of the cells 561, 562 by respectively configuring with one of the wires 573, 575 in the connection structure.

Figure 7:
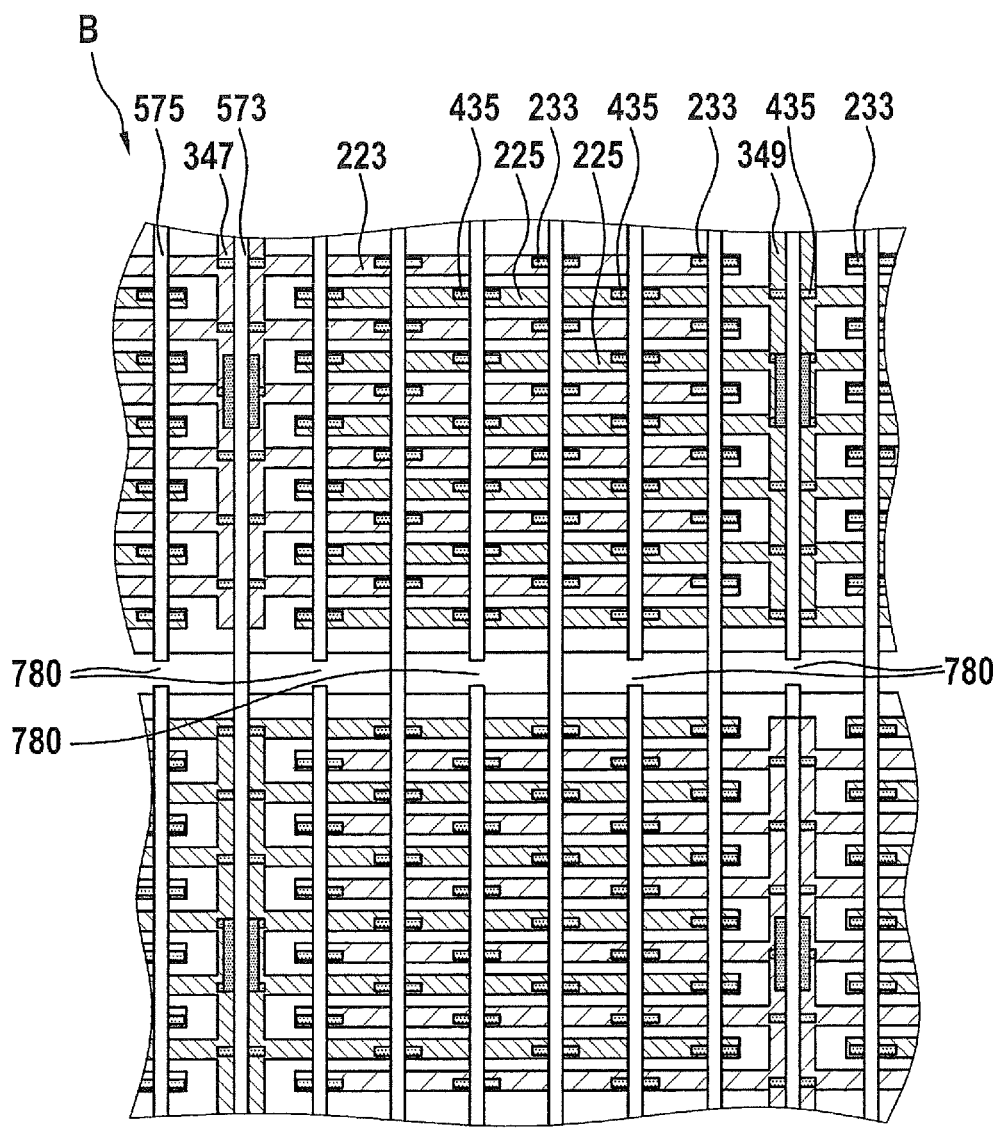
FIG. 7 shows a rear side view of a section of a solar cell according to an exemplary embodiment of the present disclosure.

FIG. 7 shows the section B shown in FIG. 6 according to another process step for manufacturing a solar cell according to an exemplary embodiment of the present disclosure. In contrast to FIG. 6, a number of interruptions 780 are shown in FIG. 7, which divide the first electrical lines 573 into two section at a column separating both the solar cell segments 561, 562 from each other. An interruption 780 can be realized by removing the material of the respective first electrical lines 573 in the region of the interruption 780. Alternatively, instead of the first electrical lines 573, the second electrical lines 575 can be interrupted in an appropriate manner.

The interruptions 780 are used in order to connect only the first polarity of the first solar cell segment 561 with the second polarity on the neighbouring solar cell segment 562 and not the second polarity of the first solar cell segment 561 with the first polarity of the neighbouring segment 562. Thus, undesired short circuits between the solar cell segments 561, 562 are prevented and which realizes their series connection. In order to eliminate the short circuits initially caused by continuous electrical lines 573, 575, after insertion of the wires realizing the electrical lines 573, 575, each second wire is cut in the region between the solar cell segments 561, 562, which can also be referred to as individual solar cells.

Figure 8:
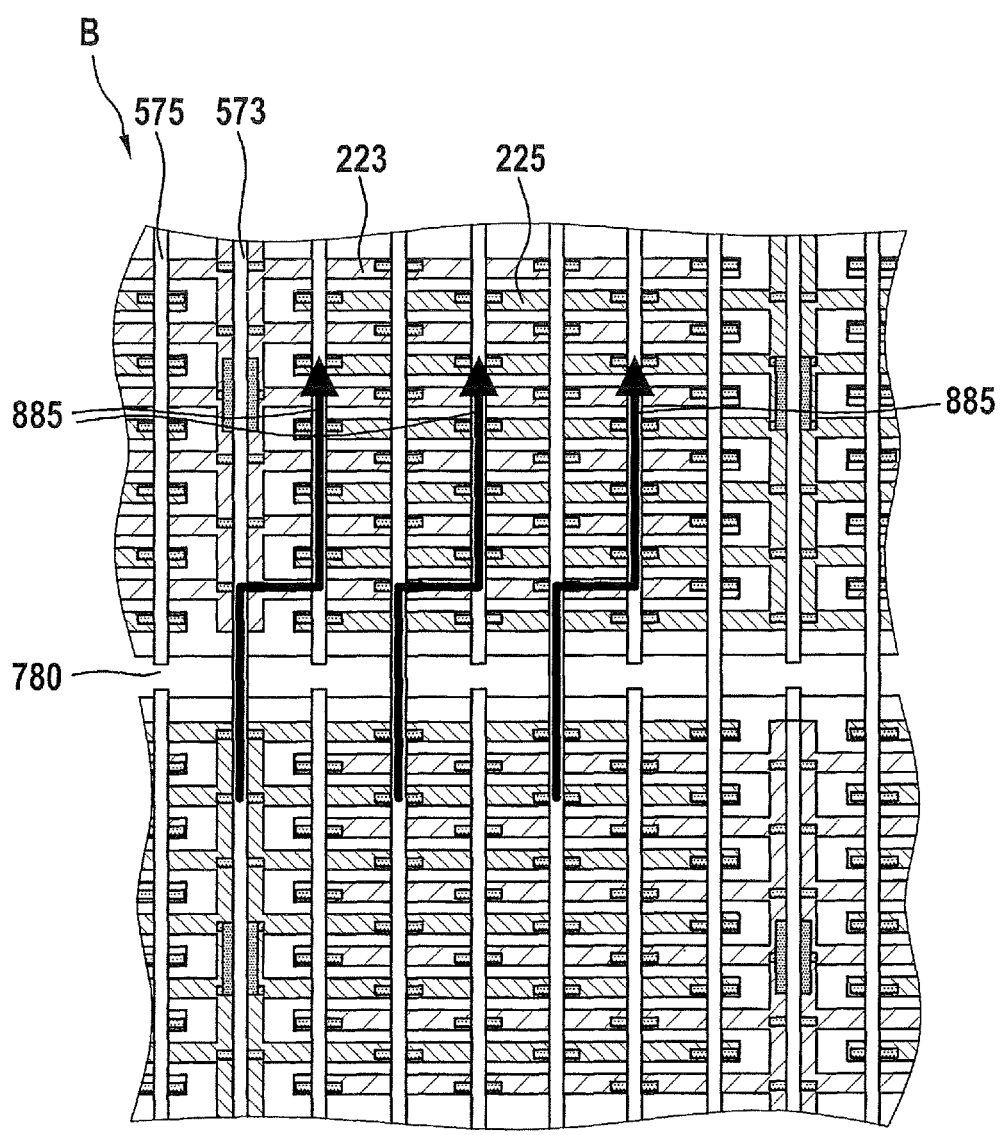
FIG. 8 shows a rear side view of a section of a solar cell according to an exemplary embodiment of the present disclosure.

FIG. 8 shows a rear side view of the section B of a solar cell shown in FIG. 7 according to an exemplary embodiment of the present disclosure. A current flow 885 through a series connection of neighbouring cells 561, 562 is shown. As shown in FIG. 8, the current flows from the base contacts over the base regions of the cells into the emitter regions and to the emitter contacts, and vice-versa. If a low-melting solder is used, the plurality of contacts 233, 435 in accordance with the disclosure are simultaneously soldered on the IBC-cells rear sides during the lamination process by the many thin wires 573, 575.

Figure 9:
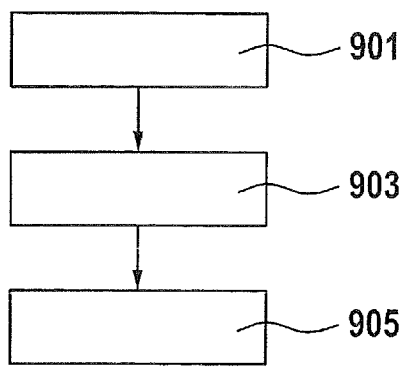
FIG. 9 shows a flow diagram of a process for manufacturing a solar cell according to an exemplary embodiment of the present disclosure.

FIG. 9 shows a flow diagram of a process for manufacturing a solar cell segment according to an exemplary embodiment of the present disclosure. Therefore, it refers to a solar cell segment, as it has been described with the help of previous figures.

In a step 901, a substrate laminated with a number of metallizing layers and a dielectric layer is provided. The substrate has doped regions for making a number of base doped regions and a number of emitter doped regions on the laminated side. The number of metallizing layers and optionally even the dielectric layer are structured in a comb shaped contact deck arrangement with base contact decks for the number of base doped regions and emitter contact decks for the number of emitter doped regions.

In a step 903, at least one row of contact openings is made in the dielectric layer of the base contact decks and in a step 905, at least one row of contact openings is made in the dielectric layer of the emitter contact decks. Therefore, the steps 903, 905 can be executed simultaneously or in any order.

Figure 10:
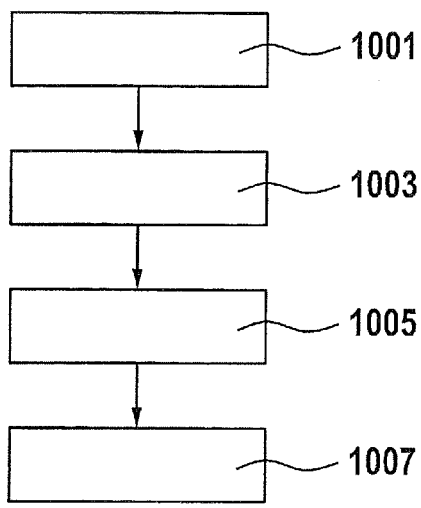
FIG. 10 shows a flow diagram of a process for manufacturing a solar cell according to an exemplary embodiment of the present disclosure.

FIG. 10 shows a flow diagram of a process for manufacturing a solar cell segment according to an exemplary embodiment of the present disclosure.

In steps 1001, 1003, at least two solar cell segments are provided and disposed such that the row or rows of first contact openings of the first solar cell segments provided align with the row or the rows of second contact openings of the second solar cell segments provided. The solar cell segments can refer to such solar cell segments, as they have been described with the help of the previous figures.

In steps 1005, 1007, the contact openings of the rows continuing over the borders of the solar cell segments are interconnected in an electrically conductive manner, for example by insertion and contacting of electrical wires or lines. Therefore, the steps 1005, 1007 can be executed simultaneously or in any order.

With the help of previous FIGS. 1 to 10, different or complementary exemplary embodiments of the present disclosure are described in the following.

According to an exemplary embodiment, the solar cell segments 561, 562 shown or the solar cell shown refers to a solar cell with rear side emitter 105 and rear side contacts of IBC-type, wherein the metallizing layers 111, 113, 115 are made on the rear side either by sputtering or evaporation or by screen printing and were optionally reinforced by chemical or electrochemical plating and wherein the metal layers 111, 113, 115 are structured in an interdigital comb shaped contact deck arrangement 223, 233 for emitter and base contacting.

For this purpose, a superficial dielectric covering/insulation layer 117 is introduced on the metallic rear side contact decks 223, 233.

A plurality of equidistant contact openings 233, 435 are made along each of the many metal decks 223, 233.

All contact openings 233, 435 in the dielectric covering/insulation layer 117 which are made on decks 223 of a first polarity, lie transverse to the decks 223 on a line, i.e. form a row 453, and which are made on decks 225 of a second polarity transverse to these decks 225 also lie in a line, i.e. form a row 455.

All rows 453 of openings 233 of the first polarity are preferably disposed in the center between two rows 455 of openings 435 on the neighbouring decks 225 of the second polarity.

The linear contact point rows of a polarity are disposed on a cell 561, such that the contact point rows of the other polarity lie in their extension on a neighbouring cell 562 which is rotated by 180°, so that a series connection of the cells 561, 562 is facilitated by a number of equidistant linear wires 573, 575 which is equal to the number of the rows 453, 455 of contact openings 233, 435.

According to an exemplary embodiment, the number of the rows 453, 455 of contact openings 233, 435 and thereby of the wires 573, 575 is greater than 10 and smaller than 80, preferably greater than 15 and smaller than 40.

The dielectric covering/insulation layer 107 is introduced in the same (sputtering or evaporation) system, i.e. similarly after the metallic layers 111, 113, 115; i.e. even before their structuring. Alternatively, the dielectric covering/insulation layer 107 is introduced after the structuring of the metallic layers 111, 113, 115, i.e. in another sputtering or evaporation system or by a PECVD system.

The small contact openings 233, 435 on the decks 223, 225 and the larger pad regions 437, 439 on the busbars 347, 349 are made by laser ablation of the dielectric covering/insulation layer 107.

The shape of the contact openings 233, 435 is elongated along the narrow decks 223, 225, i.e. transverse to the grain direction.

The length of the openings 233, 435 is sufficiently large in order to ensure making a reliable contact with the wires 473, 475. Typical, but non-restrictive dimensions of the openings 233, 435 are 1-2 mm length at a width of 0.05-0.4 mm, preferably 0.1-0.2 mm.

The structural elements of the IBC-cell in accordance with the disclosure have a series of advantages according to different exemplary embodiments.

Due to insulation layer 117 on the metallic rear side contact decks 223, 225, the connection wires 573, 575 can also be guided by touching the surface over decks 223, 225 of the respective "other" polarity, without fear of short circuit.

Due to plurality of parallel rows 453, 455 of contact openings 233, 435 and thereby a large number of wires 573, 575, the individual wire diameter can be kept small, as each should carry only a very small current.

Due to plurality of openings 233, 435 along each of several metallic decks 223, 225, a plurality of contacts are made at several wires 573, 575, so that the "current collection regions" is small, i.e. the distance of each site of current generation is very short from the next wire contact point. Thereby, the thickness of the metallic conducting layers 111, 113, 115 can be kept small, so that the lamination time remains small, thereby the output of the sputtering or evaporation system increases and hence the systems and lamination costs lower.

Due to elongated shape of the contact openings 233, 435 with any length transverse to the wire 573, 575, the contact making "wire contact surface" is self-adjusting.

Due to linear arrangement of the contact point rows 453, 455 from one cell 561, 563 to the next, the tightening and insertion of the wire-web 573, 575 is technically easy to implement. All 10 cells 561, 562 of a string can also be connected to a common wire-web 573, 575, and then the short circuits 880 can be eliminated only subsequently by caps of each second wire 575.

The described and exemplary embodiment shown in the figures are selected only as illustration. Different exemplary embodiments can be combined with each other completely or in terms of individual features. An exemplary embodiment can also be supplemented by features of another exemplary embodiment.

Further, process steps in accordance with the disclosure can be repeated and implemented in different sequence than the described sequence.

An exemplary embodiment includes an "and/or" linkage between a first feature and a second feature, so this is read such that according to an embodiment, the exemplary embodiment has the first feature as well as the second feature and according to another embodiment, has either only the first feature or only the second feature.

What is claimed is:

1. A process for manufacturing at least one solar cell segment comprising:
   making at least one first row of first contact openings in a dielectric layer on a substrate, the substrate having a rear side with a number of base doped regions and a number of emitter doped regions, the dielectric layer and at least one metallizing layer being disposed on the rear side of the substrate, the at least one metallizing layer (i) being structured into an interdigital comb shaped contact deck arrangement defining base contact decks for the number of base doped regions and emitter contact decks for the number of emitter doped regions, and (ii) being disposed between the rear side of the substrate and the dielectric layer, the at least one first row of first contact openings being made in the dielectric layer in a region of the base contact decks, wherein the at least one first row is oriented linear and transverse to a direction of longitudinal extension of the base contact decks and includes a first contact opening per base contact deck; and
   making at least one second row of second contact openings in the dielectric layer in a region of the emitter contact decks, wherein the at least one second row is oriented linear and transverse to a direction of longitudinal extension of the emitter contact decks and includes a second contact opening per emitter contact deck.

2. The process according to claim 1, further comprising:
   prior to making the at least one first row and the at least one second row, applying the at least one metallizing layer and the dielectric layer to the rear side of the substrate; and
   structuring the at least one metallizing layer and the dielectric layer for making the interdigital comb shaped contact deck arrangement.

3. The process according to claim 1, further comprising:
   prior to making the at least one first row and the at least one second row, applying the at least one metallizing layer;
   structuring the at least one metallizing layer for making the interdigital comb shaped contact deck arrangement; and
   applying the dielectric layer on at least one surface of the interdigital comb shaped contact deck arrangement.

4. The process according to claim 1, wherein:
   making at least one first row of first contact openings includes making at least two first rows of first contact openings in the dielectric layer lying in the region of the base contact decks;
   the at least two first rows are oriented linear and transverse to the direction of longitudinal extension of the base contact decks and include two first contact openings per base contact deck;
   making at least one second row of second contact openings includes making at least two second rows of second contact openings in the dielectric layer in the region of the emitter contact decks; and
   the at least two second rows are oriented linear and transverse to the direction of longitudinal extension of the emitter contact decks and include two second contact openings per emitter contact deck.

5. The process according to claim 4, wherein one of the second rows of the at least two second rows extends centrally between the at least two first rows.

6. The process according to claim 1, wherein:
   an even number of 10 to 80 rows of the at least one first row are made,
   an even number of 10 to 80 rows of the at least one second row are made, and
   an equal number of the at least one first row and the at least one second row are alternately made.

7. The process according to claim 1, wherein the first contact openings and the second contact openings are made by laser ablation.

8. The process according to claim 1, wherein:
the first contact openings and the second contact openings are configured as elongated openings, and
a direction of longitudinal extension of the first contact openings and the second contact openings extends parallel to the direction of longitudinal extension of the base contact decks and the direction of longitudinal extension of the emitter contact decks.

9. The process according to claim 1, further comprising:
connecting the first contact openings of the at least one first row of first contact openings to a first electrical cable; and
connecting the second contact openings of the at least one second row of second contact openings to a second electrical cable.

10. The process according to claim 1, wherein the at least one solar cell segment includes a first solar cell segment and a second solar cell segment, the process further comprising:
disposing the first solar cell segment next to the second solar cell segment (i) to align the at least one first row of first contact openings of the first solar cell segment with at least one second row of second contact openings of the second solar cell segment, and (ii) to align the at least one second row of second contact openings of the first solar cell segment with at least one first row of first contact openings of the second solar cell segment;
connecting the first contact openings of the at least one first row of first contact openings of the first solar cell segment and at least one second row of second contact openings of the second solar cell segment to a first electrical cable; and
connecting the second contact openings of the at least one second row of second contact openings of the first solar cell segment and at least one first row of first contact openings of the second solar cell segment to a second electrical cable.

11. The process according to claim 10, further comprising:
interrupting either the first electrical cable or the second electrical cable at a junction region between the first solar cell segment and the second solar cell segment.

* * * * *